United States Patent
Volk et al.

(10) Patent No.: US 12,494,385 B2
(45) Date of Patent: Dec. 9, 2025

(54) RAMPED SPIN-DRY ON SEMICONDUCTOR WAFER

(71) Applicant: Texas Instruments Incorporated, Dallas, TX (US)

(72) Inventors: Christopher Volk, Lehi, UT (US); Kenneth Bogedahl, Lehi, UT (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 201 days.

(21) Appl. No.: 18/326,869

(22) Filed: May 31, 2023

(65) Prior Publication Data

US 2024/0404843 A1    Dec. 5, 2024

(51) Int. Cl.
*H01L 21/67* (2006.01)
*H01L 21/02* (2006.01)

(52) U.S. Cl.
CPC .. *H01L 21/67034* (2013.01); *H01L 21/02063* (2013.01); *H01L 21/02082* (2013.01); *H01L 21/67051* (2013.01); *H01L 21/67253* (2013.01)

(58) Field of Classification Search
CPC ......... H01L 21/02082; H01L 21/67034; H01L 21/67253; H01L 21/02063; H01L 21/67051
See application file for complete search history.

(56) References Cited

U.S. PATENT DOCUMENTS

| 5,899,216 A | * | 5/1999 | Goudie | H01L 21/67028 134/199 |
| 5,950,327 A | * | 9/1999 | Peterson | H01L 21/67028 34/328 |
| 2002/0121290 A1 | * | 9/2002 | Tang | H01L 21/67034 134/28 |
| 2005/0026455 A1 | * | 2/2005 | Hamada | H01L 21/02087 257/E21.309 |
| 2007/0082134 A1 | * | 4/2007 | Fukuda | G03F 7/168 427/337 |
| 2012/0276641 A1 | * | 11/2012 | Dimov | B01L 3/50273 436/63 |
| 2013/0000682 A1 | * | 1/2013 | DeKraker | H01L 21/67051 134/28 |
| 2018/0085780 A1 | * | 3/2018 | Kanematsu | B05D 1/002 |

* cited by examiner

*Primary Examiner* — Benjamin L Osterhout
(74) *Attorney, Agent, or Firm* — Andrew R. Ralston; Frank D. Cimino (57) ABSTRACT

Methods and apparatus for forming an integrated circuit device, including performing a spin-cleaning step at a first rotational speed on a semiconductor substrate supporting the integrated circuit device at an intermediate stage of manufacturing. A rinse fluid is then dispensed over a top surface of the substrate. A rotational speed of the substrate is increased with a constant acceleration no greater than 125 revolutions per minute per second (rpm/s) from the first rotational speed to a second rotational speed. The second rotational speed is maintained for a rinse fluid extraction period. The rotational speed is then reduced to zero.

20 Claims, 8 Drawing Sheets

RAMPED SPIN-DRY ON SEMICONDUCTOR WAFER

BACKGROUND OF THE DISCLOSURE

Some integrated circuit (IC) devices include two or more "metal" layers each comprising electrically conductive elements separated by dielectric material. An interlayer dielectric interposing the metal layers comprises conductive vias vertically connecting the electrically conductive elements of vertically opposing ones of the metal layers. The vias are formed by etching or otherwise creating vertical openings in the interlayer dielectric layer, and then filling the openings with metal.

SUMMARY OF THE DISCLOSURE

This summary is provided to introduce a selection of concepts that are further described below in the detailed description. This summary is not intended to identify indispensable features of the claimed subject matter, nor is it intended for use as an aid in limiting the scope of the claimed subject matter.

The present disclosure introduces a method of forming an IC, comprising: performing a spin-cleaning step at a first rotational speed on a semiconductor substrate supporting the IC at an intermediate stage of manufacturing; then dispensing a rinse fluid over a top surface of the substrate; increasing a rotational speed of the substrate with a constant acceleration no greater than 125 revolutions per minute per second (rpm/s) from the first rotational speed to a second rotational speed; maintaining the second rotational speed for a rinse fluid extraction period; and then reducing the rotational speed to zero.

The present disclosure also introduces a method of forming an IC, comprising: performing a fluid-based process on a semiconductor wafer including the IC at an intermediate stage of manufacturing, the fluid-based process including rotating the wafer at a first rotational speed; dispensing a rinse fluid onto the wafer after the fluid-based process; and then increasing rotational speed of the wafer with a constant acceleration to a second rotational speed over an acceleration period no less than five seconds.

The present disclosure also introduces a system, comprising: a motor operable for rotating a wafer, wherein the wafer comprises a plurality of partially formed IC devices each having a plurality of via openings; a nozzle operable for dispensing a rinse fluid onto the wafer; and a processing system operable for controlling rotation of the wafer via operation of the motor, including while: (A) rinsing the wafer with the rinse fluid while rotating the wafer at a first speed; and (B) cleaning the wafer by increasing the wafer rotation to a second speed utilizing a constant acceleration that is no greater than 125 rpm/s.

The present disclosure also introduces a method of forming an IC, comprising: performing a fluid-based process on a semiconductor wafer including the IC at an intermediate stage of manufacturing, the fluid-based process including rotating the wafer at a first rotational speed; dispensing a rinse fluid onto the wafer after the fluid-based process; then increasing rotational speed of the wafer to a second rotational speed with a constant acceleration to a second rotational speed with a constant acceleration no greater than 125 rpm/s; maintaining the second rotational speed for a rinse fluid extraction period; and then reducing the rotational speed to zero.

These and additional aspects of the present disclosure are set forth in the description that follows, and/or may be learned by a person having ordinary skill in the art by reading the material herein and/or practicing the principles described herein. At least some aspects of the present disclosure may be achieved via means recited in the attached claims.

BRIEF DESCRIPTION OF THE DRAWINGS

The present disclosure is understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for simplicity and clarity, and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Various disclosed methods and devices of the present disclosure may be beneficially applied to semiconductor device (e.g., IC) manufacturing to reduce particulate contamination of a substrate (e.g., wafer) resulting from a wet clean after formation of via openings. While such examples may be expected to provide improvements in yield and/or reliability of such devices, no particular result is a requirement unless explicitly recited in a particular claim.

Figure 1:
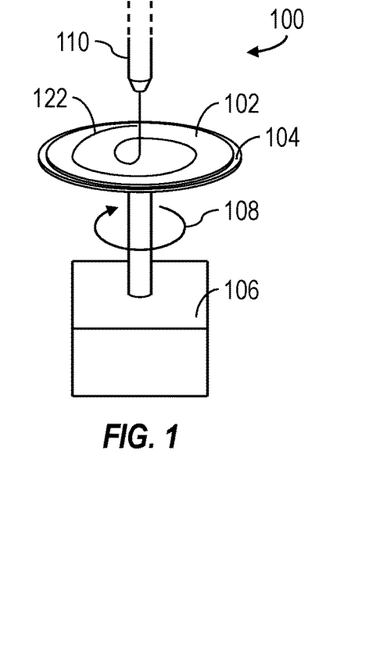
FIG. 1 is a schematic view of at least a portion of an example implementation of an apparatus dispensing a rinse fluid on a semiconductor substrate according to one or more aspects of the present disclosure.

FIG. 1 is a schematic perspective view of a system 100 for performing spin-rinsing of a wafer 102 according to one or more aspects of the present disclosure. The wafer 102 comprises a plurality of integrated circuit devices (not shown) in an intermediate stage of manufacture in which via openings have been formed by known or future-developed processes and are now being cleaned prior to filling with metal. The wafer 102 is affixed to a platen or other structure 104 that is rotated via operation of an electric motor or other prime mover 106, as indicated in FIG. 1 by arrow 108. The system 100 also includes one or more nozzles and/or other means 110 for dispensing one or more rinse fluids 122 onto the wafer 102.

Figure 2:
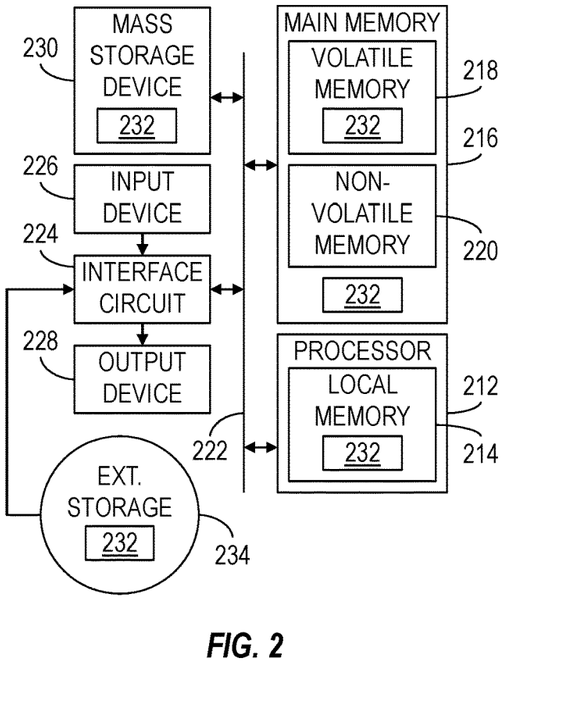
FIG. 2 is a block diagram of at least a portion of an example implementation of a processing system according to one or more aspects of the present disclosure.

FIG. 2 is a schematic view of at least a portion of an example implementation of a processing system 200 according to one or more aspects of the present disclosure. The processing system 200 may be communicably connected to (or at least partially comprise) the prime mover 106 to control the rotational speed and acceleration of the wafer 102 during, for example, an implementation of the spin-rinsing process depicted in FIG. 1 and/or otherwise described herein. Accordingly, the following description concurrently refers to FIGS. 1 and 2.

The processing system 200 may be or comprise, for example, one or more processors, controllers, special-purpose computing devices, personal computers (PCs, e.g., desktop, laptop, and/or tablet computers), personal digital assistants, smartphones, industrial PCs (IPCs), programmable logic controllers (PLCs), servers, internet appliances, and/or other types of computing devices. Although it is possible that the entirety of the processing system 200 is implemented within one device, it is also contemplated that one or more components or functions of the processing system 200 may be implemented across multiple devices.

The processing system 200 may comprise a processor 212, such as a general-purpose programmable processor. The processor 212 may comprise a local memory 214 and may execute machine-readable and executable program code instructions 232 (i.e., computer program code) present in the local memory 214 and/or other memory device. The processor 212 may be, comprise, or be implemented by one or more processors of various types suitable to the local application environment, and may include one or more general-purpose computers, special-purpose computers, microprocessors, digital signal processors (DSPs), field-programmable gate arrays (FPGAs), application-specific integrated circuits (ASICs), graphics processing units (GPUs), and/or processors based on a multi-core processor architecture, as non-limiting examples. Examples of the processor 212 include one or more INTEL microprocessors, microcontrollers from the ARM and/or PICO families of microcontrollers, and embedded soft/hard processors in one or more FPGAs.

The processor 212 may execute, among other things, the program code instructions 232 and/or other computer instructions and/or programs to implement the example methods and/or operations described herein. For example, the program code instructions 232, when executed by the processor 212 of the processing system 200, may cause the processor 212 to control the rotational speed and acceleration of the wafer 102 during spin-rinsing. The program code instructions 232, when executed by the processor 212, may also control dispensing of the one or more rinse fluids 122.

The processor 212 may be in communication with a main memory 216, such as may include a volatile memory 218 and a non-volatile memory 220, perhaps via a bus 222 and/or other communication means. The volatile memory 218 may be, comprise, or be implemented by random-access memory (RAM), static RAM (SRAM), dynamic RAM (DRAM), synchronous DRAM (SDRAM), RAMBUS DRAM (RDRAM), and/or other types of RAM devices. The non-volatile memory 220 may be, comprise, or be implemented by read-only memory, flash memory, and/or other types of memory devices. One or more memory controllers (not shown) may control access to the volatile memory 218 and/or the non-volatile memory 220.

The processing system 200 may also comprise an interface circuit 224 in communication with the processor 212, such as via the bus 222. The interface circuit 224 may be, comprise, or be implemented by various types of standard interfaces, such as an Ethernet interface, a universal serial bus (USB), a third-generation input/output (3GIO) interface, a wireless interface, a cellular interface, and/or a satellite interface, among others. The interface circuit 224 may comprise a graphics driver card. The interface circuit 224 may comprise a communication device, such as a modem or network interface card to facilitate exchange of data with external computing devices via a network (e.g., Ethernet connection, DSL, telephone line, coaxial cable, cellular telephone system, satellite, etc.).

The processing system 200 may be in communication with various sensors, video cameras, actuators, processing devices, controllers, and other devices via the interface circuit 224. The interface circuit 224 can facilitate communications between the processing system 200 and one or more devices by utilizing one or more communication protocols, such as an Ethernet-based network protocol (such as ProfiNET, OPC, OPC/UA, Modbus TCP/IP, EtherCAT, UDP multicast, Siemens S7 communication, or the like), a proprietary communication protocol, and/or other communication protocols.

An input device 226 may also be connected to the interface circuit 224. The input device 226 may permit personnel to enter the program code instructions 232, which may be or comprise control data, operational parameters, and/or operational set-points. The program code instructions 232 may further comprise modeling or predictive routines, equations, algorithms, processes, applications, and/or other programs operable to perform example methods and/or operations described herein. The input device 226 may be, comprise, or be implemented by one or more of a keyboard, a mouse, a joystick, a touchscreen, a trackpad, a trackball, and/or a voice recognition system, among other examples. One or more output devices 228 may also be connected to the interface circuit 224. The output devices 228 may permit visualization and/or other sensory perception of various data, such as sensor data, status data, and/or other example data. The output devices 228 may be, comprise, or be implemented by video output devices (e.g., a liquid crystal display (LCD), a light-emitting diode (LED) display, a cathode ray tube (CRT) display, a touchscreen, etc.), printers, and/or speakers, among other examples.

The processing system 200 may comprise a mass storage device 230 for storing data and program code instructions 232. The mass storage device 230 may be connected to the processor 212, such as via the bus 222. The mass storage device 230 may be or comprise a tangible, non-transitory storage medium, such as a hard disk drive, a compact disk (CD) drive, and/or digital versatile disk (DVD) drive, among other examples. The processing system 200 may be communicatively connected with an external storage medium 234 via the interface circuit 224. The external storage medium 234 may be or comprise a removable storage medium (e.g., a CD or DVD), such as may be operable to store data and program code instructions 232.

As described above, the program code instructions 232 may be stored in the mass storage device 230, the main memory 216, the local memory 214, and/or the removable storage medium 234. Thus, the processing system 200 may be implemented in accordance with hardware (perhaps implemented in one or more chips including an integrated circuit, such as an ASIC), or may be implemented as software or firmware for execution by the processor 212. In the case of firmware or software, the implementation may be provided as a computer program product including a non-transitory, computer-readable medium or storage structure embodying computer program code instructions 232 (i.e., software or firmware) thereon for execution by the processor 212. The program code instructions 232 may include program instructions or computer program code that, when executed by the processor 212, may perform and/or cause performance of example methods, processes, and/or operations described herein.

Figure 3:
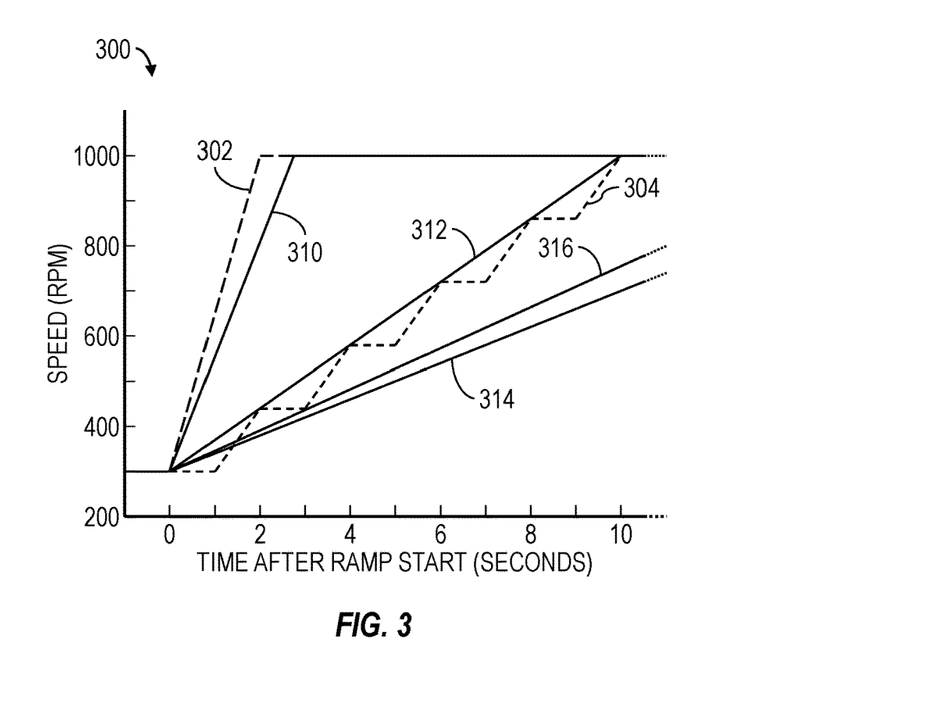
FIG. 3 is a graph depicting several ramp profiles for spin-rinsing, including baseline ramp profiles and example ramp profiles according to one or more aspects of the present disclosure.

With concurrent reference to FIG. 1, FIG. 3 is a graph 300 depicting a spin-rinsing ramp profile 302 (shown by dashed lines) utilized in some baseline process flows for cleaning via openings, such as after a rinse fluid 122 has been dispensed onto the wafer 102 while the wafer 102 is being rotated at a first rotational speed (e.g., 300 revolutions per minute (rpm)). The baseline spin-rinsing ramp profile 302 includes increasing the wafer rotational speed to a second rotational speed (e.g., 1,000 rpm) utilizing an acceleration profile having a single acceleration rate of 350 rpm per second (rpm/s). However, the rapid acceleration may atomize the rinse fluid, which can result in residual moisture/chemicals remaining in the via openings, such that vias may not be adequately formed in the openings during subsequent processing.

FIG. 3 also depicts another ramp profile 304 (shown by dashed lines) of a rinse process that may be used in some baseline process flows, the rinse process to resolve the atomization utilizing multiple rapid acceleration steps alternating with periods of constant speed. However, despite the stepped profile 304, the rapid acceleration steps can also leave residual rinse fluid in the via openings.

The inventors have determined the heretofore unrecognized phenomenon that excessive acceleration, at least at certain points in the spin-rinsing process, may result in atomization of a rinse fluid, resulting in incomplete removal of the rinse fluid before drying the substrate. Particles carried by atomized droplets of the rinse fluid may thus be transported from the via openings to other locations on the substrate, sometimes too late to be removed with other rinse fluid on the wafer surface, resulting in particulate contamination that may adversely affect formation of other features of the IC at later stages of formation. The inventors have further recognized that such undesirable effects may be at least partially mitigated by limiting the acceleration of the rotational velocity of the substrate in a manner that discourages such atomization so that the rinse fluid, and any particles carried thereby, are effectively transported from the substrate into the waste stream. Further description provide details of such favorable processes.

FIG. 3 also depicts example spin-rinsing ramp profiles 310, 312, 314 according to aspects introduced by the present application, by which the rotational speed of the wafer is increased from the first rotational speed to the second rotational speed with a single constant acceleration no greater than 125 rpm/s. For example, the spin-rinsing ramp profile 310 utilizes a single constant acceleration of 125 rpm/s, the spin-rinsing ramp profile 312 utilizes a single constant acceleration of 70 rpm/s, and the spin-rinsing ramp profile 314 utilizes a single constant acceleration of 40 rpm/s. Other spin-rinsing ramp profiles within the scope of the present disclosure may utilize a single constant acceleration between 40 and 125 rpm/s, such as another spin-rinsing ramp profile 316 depicted in FIG. 3 having a single constant acceleration of 50 rpm/s. Additional spin-rinsing ramp profiles within the scope of the present disclosure may include a single constant acceleration not greater than 50 rpm/s, or not greater than 40 rpm/s, among other examples. The maximum acceleration of spin-rinsing processes in the scope of the disclosure may be a function of, for example, the chemical components of the rinse fluid, the depth and/or aspect ratio of substrate openings (e.g., via holes), and/or other factors.

The rinse fluid used in various examples may be a pure substance or a mixture of substances (e.g., a solution). A solution including water may be referred to as an aqueous solution. In some implementations, the rinse fluid may be pure water. In some implementations, the rinse fluid may be an aqueous solution that includes a polar organic compound such as an alcohol, a ketone, or an acid. Such examples may include methanol, ethanol, 1-propanol, 2-propanol (isopropyl alcohol, or IPA), 2-propanone (acetone), or ethanoic (acetic) acid.

The rinse fluid has a viscosity, a surface tension, and an interfacial energy with the substrate that may be characterized by wettability of the substrate. The tendency to atomize is expected to generally depend on at least these characteristics. The maximum spin acceleration may be referred to as a "critical acceleration", and is generally different for different rinse fluid formulations. Thus, for example, the critical acceleration of a rinse fluid that is predominantly water may be different than a critical acceleration of a rinse fluid that includes or is predominantly IPA.

The inventors have discovered that by limiting the spin acceleration to a value below the critical acceleration, the surface tension and/or wettability contribute to maintaining the rinse fluid as a substantially contiguous layer that draws the rinse fluid out of the substrate openings and transports contaminants (e.g., particles) to the wafer edge from which the rinse fluid departs the surface of the substrate. Examples consistent with this principle have been found to have significantly less contamination after the spin-rinsing process than baseline processes, as described further below.

In some implementations, the critical acceleration may be greater for a rinse fluid with a lesser viscosity and lower for a rinse fluid with a greater viscosity. For example, water has a viscosity of about 0.9 millipascal seconds (mPa·s, or centipoise (cP)) and IPA has a viscosity of about 2 mPa·s. A rinse fluid that is 100% water may thus have a lower critical acceleration value compared to a rinse fluid that is 100% IPA. However, a useful range of acceleration values for different rinse fluids may overlap, providing a smaller range of acceleration values that may be effective for a number of different rinse fluids, simplifying manufacturing line configuration in a fabrication environment.

Figure 4:
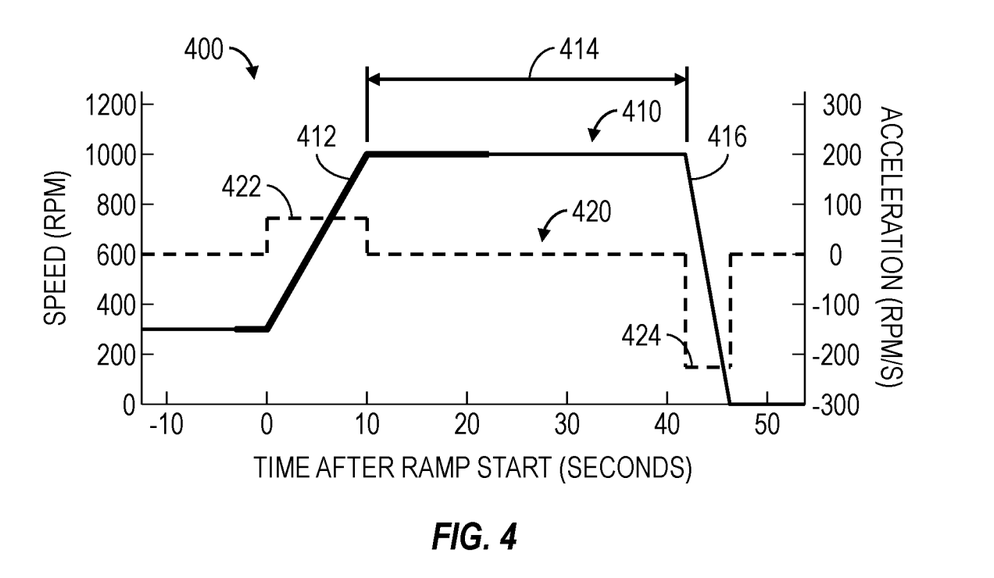
FIG. 4 is a graph depicting an example implementation of a speed profile for spin-rinsing according to one or more aspects of the present disclosure.

FIG. 4 is a graph 400 depicting a first example implementation of a spin-rinsing speed/acceleration profile according to aspects introduced in the present disclosure. In this example, without implied limitation, the rinse fluid is an aqueous solution including 99-100% IPA. The speed/acceleration profile includes a speed profile 410 and an acceleration profile 420. The speed profile 410 depicts wafer rotational speed (rpm) versus time (seconds) and the acceleration profile 420 depicts (in dashed lines) wafer rotation acceleration (rpm/s) versus the same time frame as the speed profile 410.

The acceleration profile 420 includes an acceleration period 422 including a single, constant acceleration of 70 rpm/s for 10 seconds, resulting in a speed ramp 412 by which the wafer rotational speed is increased from a first non-zero speed (e.g., 300 rpm) to a second speed (e.g., 1,000 rpm). A rinse fluid may be dispensed onto the wafer before, during, and/or after the acceleration period 422. For example, in FIG. 4, a thicker portion of the speed profile 410 depicts a period during which the rinse fluid is dispensed onto the wafer from about 3 seconds prior to the acceleration period 422 until about 22 seconds after the acceleration period 422. After the acceleration period 422, the second speed is maintained for a rinse fluid extraction period 414 of sufficient duration to remove the rinse fluid and debris from the via openings and effectively transport the rinse fluid and contamination to the wafer edge. For example, the rinse fluid extraction period 414 may be at least about 20 seconds, and is depicted in FIG. 4 as being about 32 seconds. The rotation of the wafer is reduced to zero in a deceleration period 424. The deceleration is not limited to any particular value, and is shown as being about 230 rpm/s for 4-5 seconds.

Figure 5:
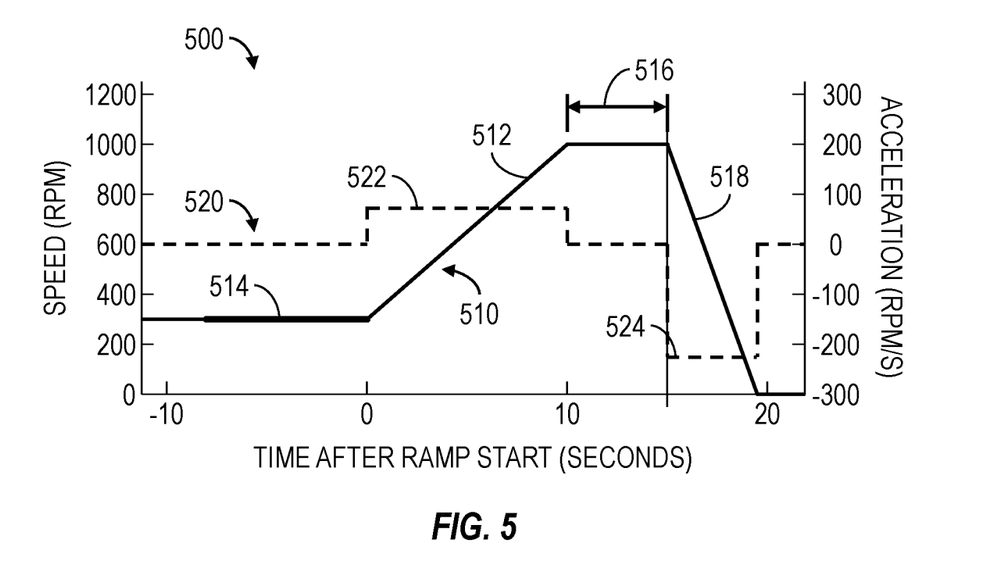
FIG. 5 is a graph depicting another example implementation of a speed profile for spin-rinsing according to one or more aspects of the present disclosure.

FIG. 5 is a graph 500 depicting another example implementation of a spin-rinsing speed/acceleration profile according to aspects introduced in the present disclosure. In this example, without implied limitation, the rinse fluid is an aqueous solution including 90-100% water. The speed/acceleration profile includes a speed profile 510 depicting wafer rotational speed (rpm) versus time (seconds) and an acceleration profile 520 depicting (in dashed lines) wafer rotation acceleration (rpm/s) versus the same time frame as the speed profile 510.

The acceleration profile 520 includes an acceleration period 522 including a single, constant acceleration of 70 rpm/s for 10 seconds, resulting in a speed ramp 512 by which the wafer rotational speed is increased from a first non-zero speed (e.g., 300 rpm) to a second speed (e.g., 1,000 rpm). The rinse fluid may be dispensed onto the wafer before, during, and/or after the acceleration period 522. For example, in FIG. 5, a thicker portion of the speed profile 510 depicts a period 514 during which the rinse fluid is dispensed onto the wafer for about 8 seconds prior to the acceleration period 522. After the acceleration period 522, the second speed is maintained for a rinse fluid extraction period 516 of sufficient duration to remove the rinse fluid and debris from the via openings and effectively transport the rinse fluid and contamination to the wafer edge. For example, the rinse fluid extraction period 516 is depicted in FIG. 5 as being about 5 seconds. A deceleration period 524, again not limited to any particular value, includes deceleration of about 220 rpm/s for 4-5 seconds, resulting in a speed ramp 518 that reduces the wafer rotational speed to zero.

The values described above with respect to FIGS. 4 and 5 are presented merely as examples. Other values may also be utilized for spin-rinsing via openings within the scope of the present disclosure. For example, the acceleration periods 422, 522 may be about ten seconds, as depicted in FIGS. 4 and 5, but may otherwise be no less than five seconds.

Figure 6A:
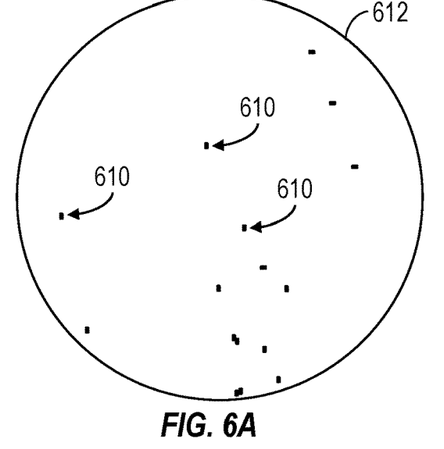
FIGS. 6A and 6B depict example defects on a wafer before and after a baseline spin-rinsing process, respectively.
Figure 6B:
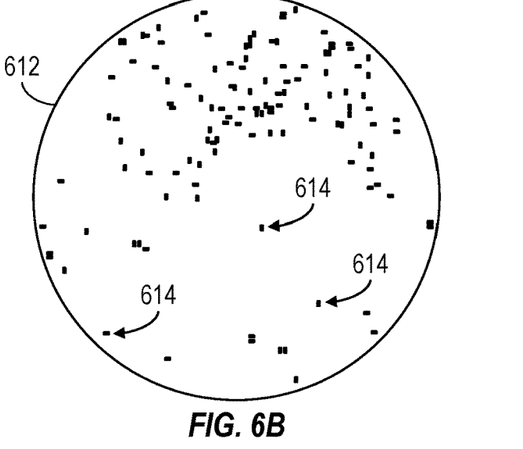

Spin-rinsing according to one or more aspects introduced in the present disclosure can reduce the number of defects (e.g., residual rinse fluid, ash, and/or other processing debris) remaining after such spin-rinsing. For example, FIG. 6A depicts about 30 defects (some of which are identified by reference number 610) existing on an example wafer 612 after forming via openings but before spin-rinsing, wherein such defects are attributable to pre-cleaning processing debris. However, FIG. 6B depicts about 100 added defects (some of which are identified by reference number 614) after a baseline spin-rinsing process. The defectivity is thought to be due to atomized rinse fluid remaining in via openings. Thus, the spin-rinsing process performed between the inspections depicted in FIGS. 6A and 6B actually increased the number of defects by 330%.

Figure 6C:
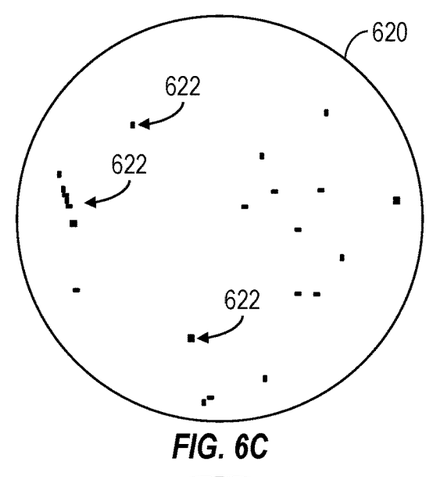
FIGS. 6C and 6D depict example defects on a wafer before and after, respectively, an example implementation of spin-cleaning according to one or more aspects of the present disclosure.
Figure 6D:
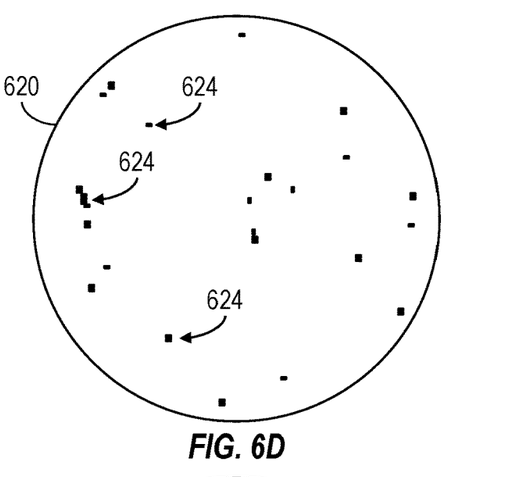

FIG. 6C depicts another example wafer 620 having about 40 defects (some identified by reference number 622) attributable to pre-cleaning processing debris prior to spin-rinsing by a process that implements the example depicted in FIG. 5 using a rinse fluid having 90-100% water. FIG. 6D depicts the wafer 620 with about 34 defects (some identified by reference number 624) remaining after the spin-rinsing process. Thus, this example spin-rinsing process reduced defect count by about 15%, as compared to the ~330% increase of defect count for the baseline process depicted in FIGS. 6A and 6B.

Figure 6E:
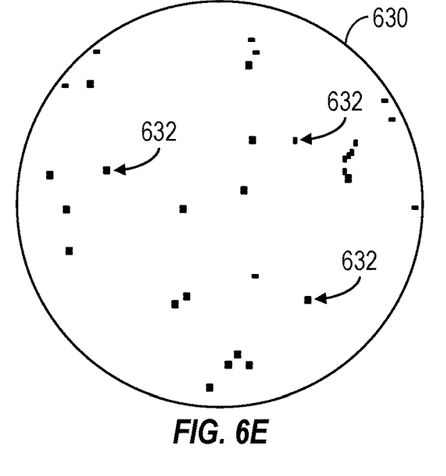
FIGS. 6E and 6F depict example defects on a wafer before and after, respectively, another example implementation of spin-rinsing according to one or more aspects of the present disclosure.
Figure 6F:
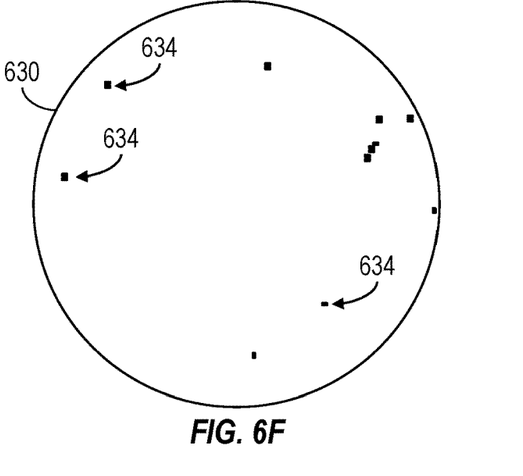

FIG. 6E depicts another example wafer 630 having about 50 defects (some identified by reference number 632) prior to spin-rinsing by a process the implements the example depicted in FIG. 4 using a rinse fluid comprising an aqueous solution having 99-100% IPA. FIG. 6F depicts the wafer 630 after the spin-rinsing process and having a defect count of about 24 defects (some identified by reference number 634). Thus, this example spin-rinsing process reduced defect count by about 52%, as compared to the ~15% decrease of defect count for the process depicted in FIGS. 6C and 6D. The greater reduction of particle count depicted by FIGS. 6E and 6F may be attributable to the greater viscosity of IPA, relative to water, increasing the effectiveness of IPA in transporting defect-causing particles to the wafer edge.

Turning now to FIGS. 7-14, respective sectional views are shown of a portion of an example implementation of an IC device 700 at intermediate stages of manufacture according to one or more aspects of the present disclosure. The IC device 700 is one example of the IC devices that may be manufactured utilizing one or more aspects of spin-rinsing introduced herein.

The IC device 700 is one of multiple nominally identical devices being formed concurrently on or over a semiconductor substrate 704 (or "wafer") comprising, e.g., silicon, gallium arsenide, gallium nitride, silicon carbide, gallium nitride on silicon, and/or other semiconductor material. A metal layer 708 is formed on one or more intermediate layers that are formed over the substrate 704 and schematically represented in FIG. 7 by reference number 712. The metal layer 708 comprises electrically conductive elements 716, or horizontal interconnects, to be contacted by subsequently formed vias, or vertical interconnects.

Figure 7:
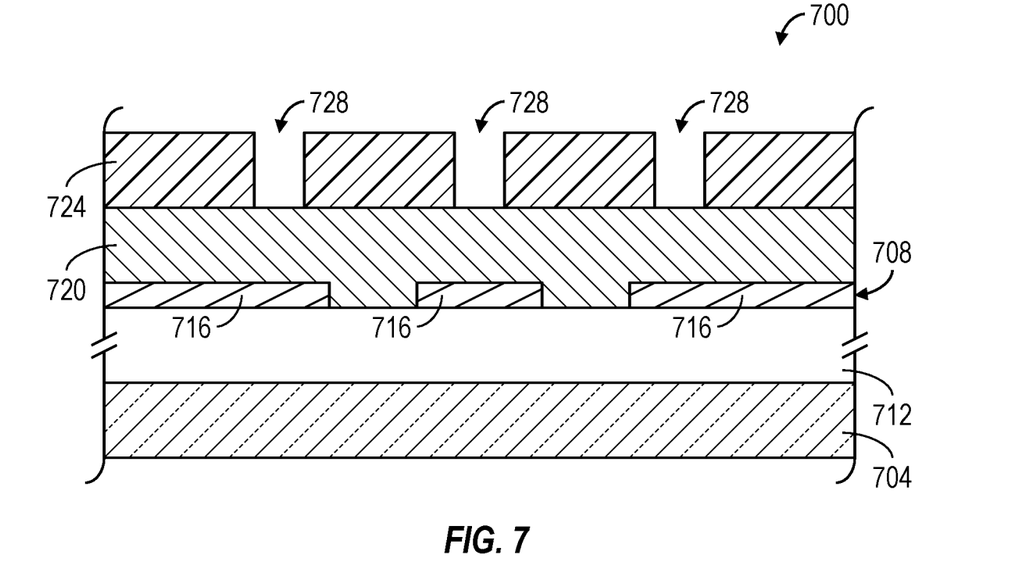
FIGS. 7-15 are respective sectional views of a portion of an example implementation of an IC at intermediate stages of manufacture according to one or more aspects of the present disclosure.

A dielectric layer 720 is formed over the metal layer 708, including in gaps between the electrically conductive elements 716. The dielectric layer 720 may be formed of silicon nitride (SiNx) and/or silicon oxide (SiOx), perhaps to a thickness in the range of 500 nm to 1.5 μm, although other materials and thicknesses are also within the scope of the present disclosure. The dielectric layer 720 may be formed using plasma enhanced chemical vapor deposition (PECVD), followed by chemical-mechanical planarization (CMP), although other processes may also or instead be utilized.

A patterned photoresist layer 724 is formed over the dielectric layer 720 by one or more known and/or future-developed processes. The patterned photoresist layer 724 includes openings 728 aligned with intended locations of via openings to be formed in the dielectric layer 708.

Figure 8:
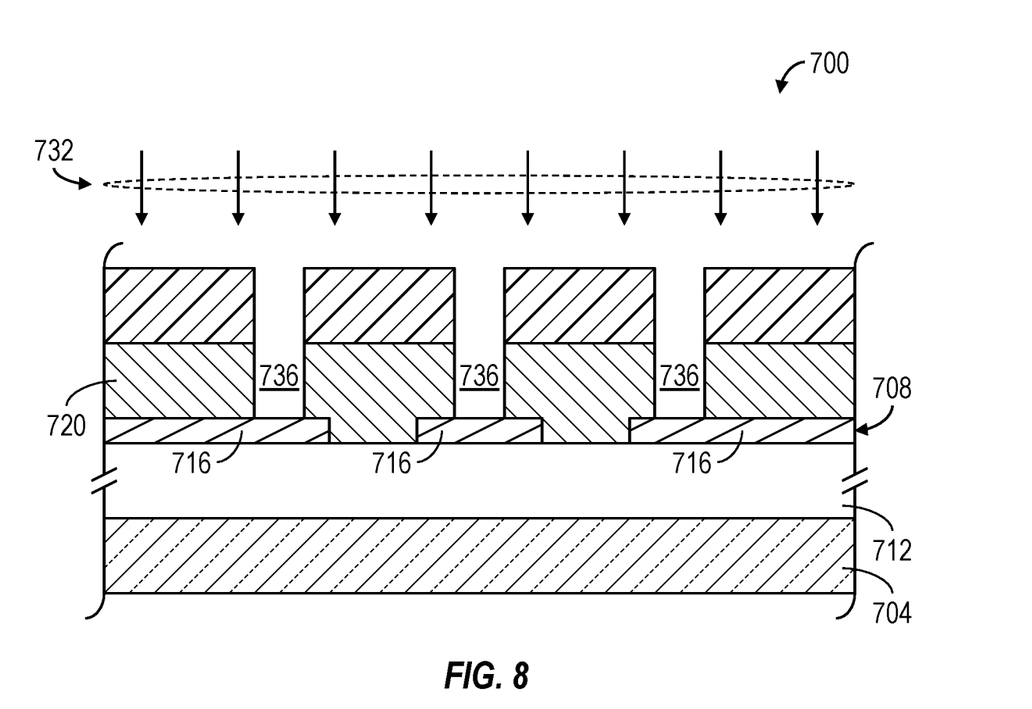

FIG. 8 is a sectional view of the IC device 700 shown in FIG. 7 in a subsequent stage of manufacture during which a dry etching process 732 is being utilized to extend the photoresist openings 728 into the dielectric layer 720, thereby forming via openings 736 each extending to one of the electrically conductive elements 716. The via openings 736 may have an aspect ratio (i.e., depth:diameter) of at least 2.0 and/or a diameter not greater than one micron. However, other dimensions are also within the scope of the present disclosure.

Figure 9:
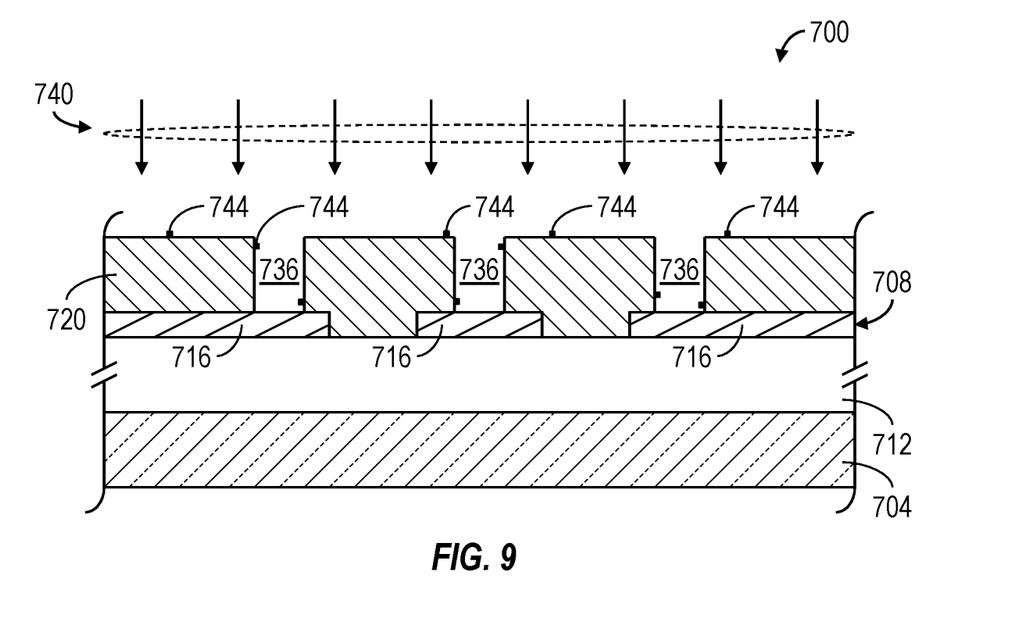

FIG. 9 is a sectional view of the IC device 700 shown in FIG. 8 in a subsequent stage of manufacture during which an oxygen ($O_2$) ash process 740 is being utilized to remove the patterned photoresist layer 724. Typically, such an $O_2$ ash process 740 leaves ash residue over the dielectric layer 720 that may be in the form of particles 744 weakly attached to the surface of the dielectric layer 720 by electrostatic or Van der Waals forces.

Figure 10:
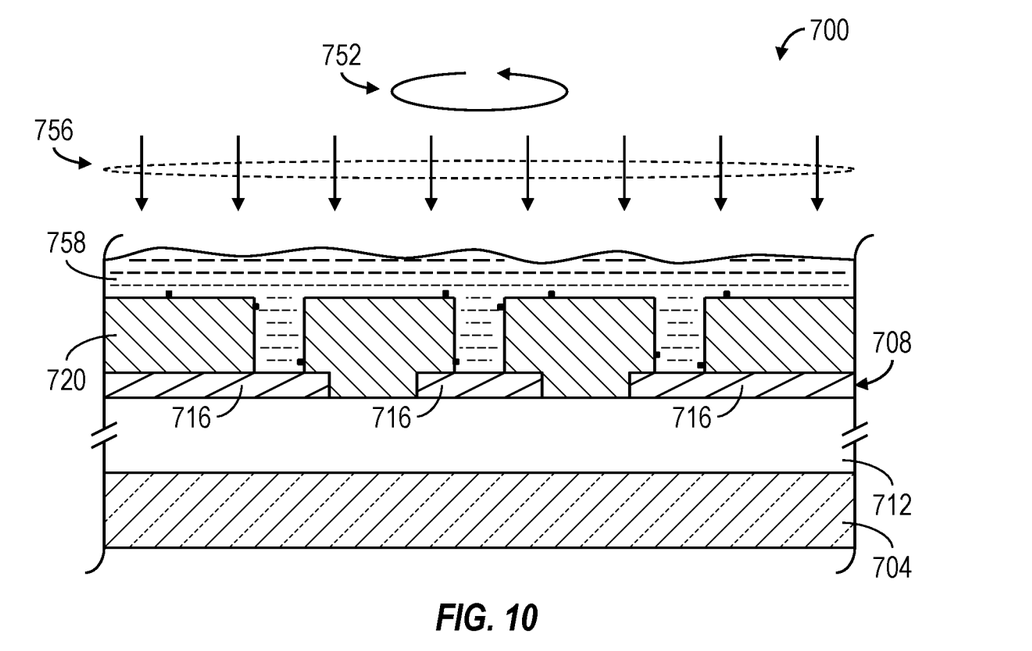

Thus, as depicted in the subsequent stage of manufacture shown in FIG. 10, a spin-cleaning process 748 including a deglazing fluid may be utilized to remove the particles 744. The spin-cleaning process 748 includes a spin process 752 and a deglazing fluid dispense step 756 to dispense a deglazing fluid 758 that may include a dilute concentration of hydrofluoric acid (HF).

Figure 11:
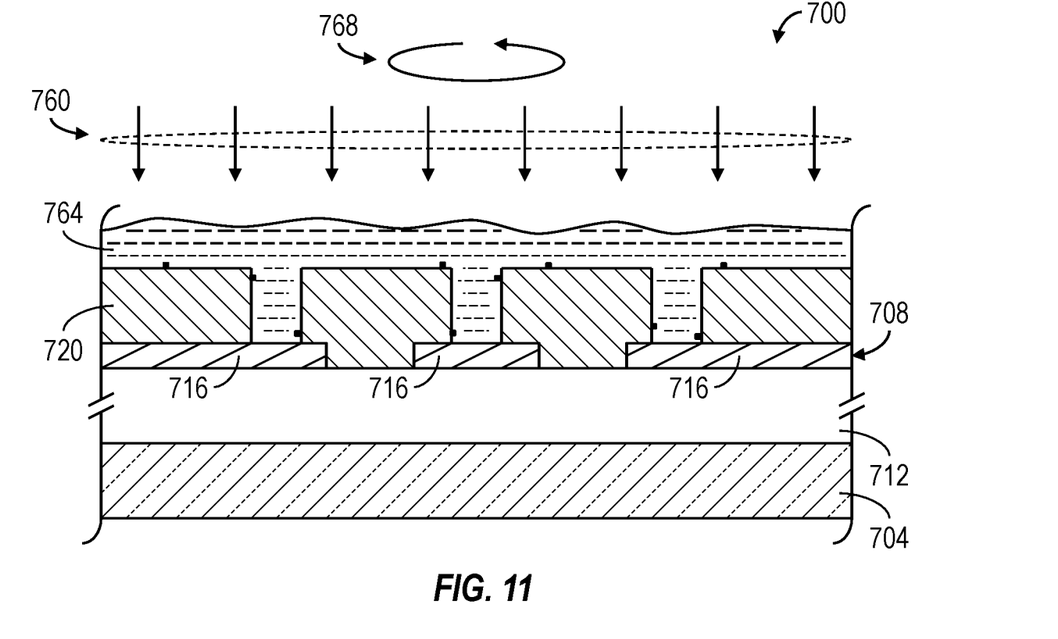

FIG. 11 is a sectional view of the IC device 700 shown in FIG. 10 in a subsequent stage of manufacture during which a rinse process includes a rinse fluid dispense step 760 to remove the deglazing fluid 752. The rinse process utilizes a rinse fluid 764, which may comprise water, isopropyl alcohol, and/or other solvents as previously described. The rinse process may also utilize a low-speed spin process 768 to distribute the rinse fluid 764 uniformly over the dielectric layer 720. For example, the spin process 768 may include maintaining the wafer rotational speed at a first speed (e.g., 300 rpm) that will be utilized in a subsequent spin-rinsing process.

FIGS. 12-15 are sectional views of the IC device 700 shown in FIG. 11 in subsequent stages of manufacture during which a spin-rinsing process is performed to remove the rinse fluid 764 and particles 744. The spin-rinsing process includes a rinse fluid dispense step 760 and a spin-dry process 772 that includes an acceleration-limited spin-clean step according to one or more aspects described above with respect to FIGS. 3-5. For example, the spin-dry process 772 may utilize a single, constant acceleration no greater than 125 rpm/s during an acceleration period of at least 5 seconds, thereby accelerating the wafer rotational speed to a second speed (e.g., 1,000 rpm), and maintaining the second speed during a rinse fluid extraction period of at least 5 seconds.

Figure 12:
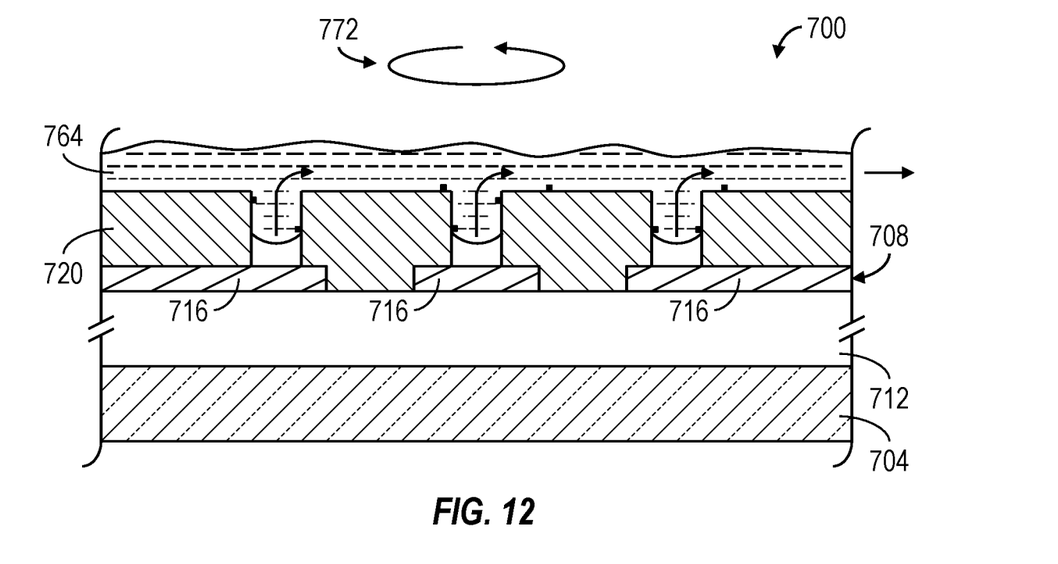

FIG. 12 illustrates the IC device 700 at an early intermediate point in the spin-dry process 772. At this time, the rinse fluid 764 over the dielectric layer 720 is pulled toward the outside of the wafer 704, drawing some of the rinse fluid 764 out of the via openings 736 by virtue of the properties of the rinse fluid 704 previously described. Some of the particles 744 originally below the currently level of the rinse fluid 704 within the via openings 736 have been carried with the rinse fluid 704 as the level rises in the via openings 736. The acceleration of the spin-dry process 772 is limited to a value above a critical minimum value to ensure that the rinse fluid 764 is drawn from the via openings 736, and below a critical maximum value above which fragmentation, or atomization, of the rinse fluid 764 could occur. In some examples, as described previously for IPA, such a critical minimum acceleration may be about 40 rpm/s, and such a critical maximum acceleration may be about 125 rpm/s.

Figure 13:
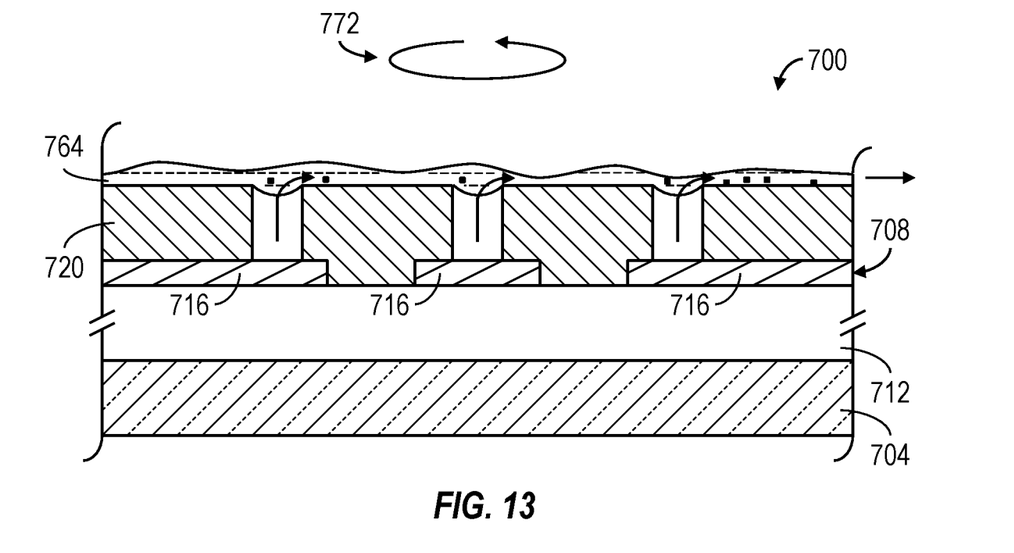

FIG. 13 illustrates the IC device 700 at later intermediate point in the spin-dry process 772. At this time, the rinse fluid 764 over the dielectric layer 720 continues to be pulled toward the outside of the wafer 704, and has drawn most or all of the rinse fluid 764 out of the via openings 736 and pulled the particles 744 out of the via openings 736 and suspended the particles 744 within the rinse fluid 704. While the acceleration of the spin-dry process 772 remains between the critical minimum value and the critical maximum value, it has increased from the acceleration value in FIG. 12, thereby removing more of the rinse fluid 704 from over the wafer 704 and lowering the level above the wafer surface. Importantly, atomization of the rinse fluid 704 is avoided or minimized to substantially prevent the formation of residual droplets of the rinse fluid 704 that might otherwise remain on the wafer surface and act as reservoirs of particles.

Figure 14:
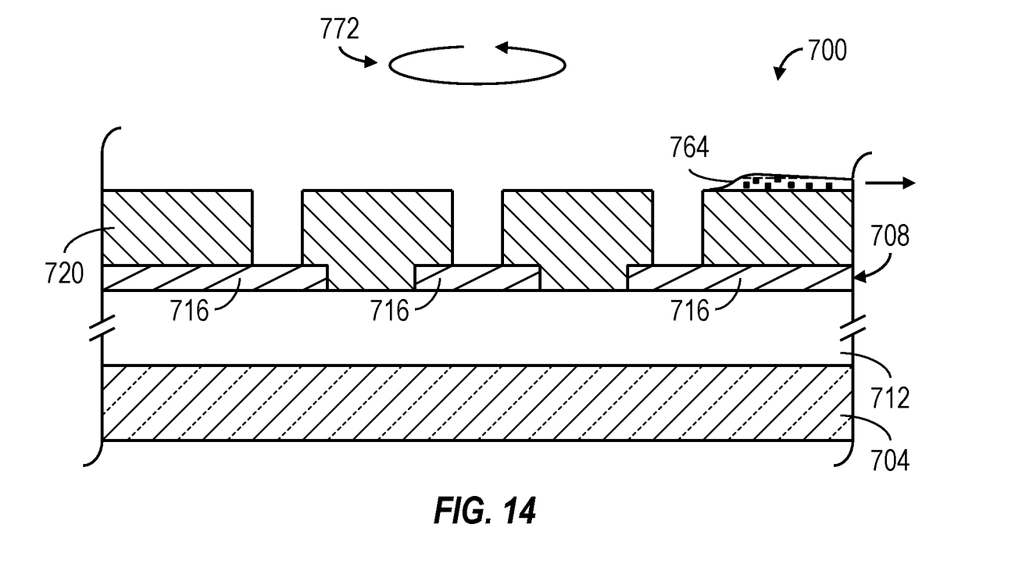

FIG. 14 illustrates the IC device 700 at a later point in the spin-dry process 772. At this time, the rinse fluid 764 has been completely or substantially removed from the via openings 736, and the particles 744 are concentrated in a remaining contiguous portion of the rinse fluid 764 that continues to move toward the wafer edge.

Figure 15:
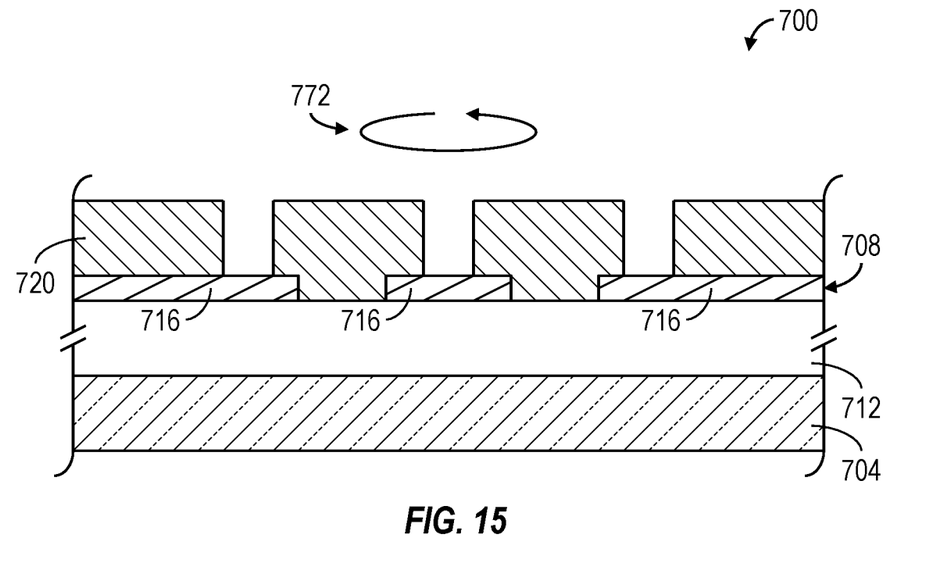

FIG. 15 illustrates the IC device 700 after complete removal of the rinse fluid 764 from over the surface of the dielectric layer 720. The spin-dry process 772 has transitioned, or will transition, to a deceleration step after a period a maximum RPM value that ensures complete removal of the rinse fluid 764.

In view of the entirety of the present disclosure, including the figures and the claims, a person having ordinary skill in the art will readily recognize that the present disclosure introduces a method of forming an IC, comprising: performing a spin-cleaning step at a first rotational speed on a semiconductor substrate supporting the IC at an intermediate stage of manufacturing; then dispensing a rinse fluid over a top surface of the substrate; increasing a rotational speed of the substrate with a constant acceleration no greater than 125 rpm/s from the first rotational speed to a second rotational speed; maintaining the second rotational speed for a rinse fluid extraction period; and then reducing the rotational speed to zero.

The constant acceleration may be not greater than 50 rpm/s, or not greater than 40 rpm/s. The constant acceleration may be between 40 and 150 rpm/s.

The method may further comprise maintaining the second rotational speed for at least 20 seconds.

During the spin-process cleaning step, the IC may comprise via openings having an aspect ratio of at least 2.0. The via openings may each have a diameter not greater than 1 micron.

The rinse fluid may be substantially water and/or IPA.

The present disclosure also introduces a method of forming an IC, comprising: performing a fluid-based process on a semiconductor wafer including the IC at an intermediate stage of manufacturing, the fluid-based process including rotating the wafer at a first rotational speed; dispensing a rinse fluid onto the wafer after the fluid-based process; and then increasing rotational speed of the wafer with a constant acceleration to a second rotational speed over an acceleration period no less than five seconds.

The constant acceleration may be about 70 rpm/s.

The acceleration period may be about 10 seconds.

The method may further comprise dispensing the rinse fluid during the acceleration period.

The method may comprise maintaining the second rotational speed for a rinse fluid extraction period, dispensing the rinse fluid during the rinse fluid extraction period, and then reducing the rotational speed to zero.

The method may comprise dispensing the rinse fluid prior to, during, and after the acceleration period.

The rinse fluid may be substantially water and/or IPA.

The method may comprise maintaining the second rotational speed for a rinse fluid extraction period and then reducing the rotational speed to zero, wherein the constant acceleration to the second rotational speed is no greater than 125 rpm/s.

The present disclosure also introduces a system, comprising: a motor operable for rotating a wafer, wherein the wafer comprises a plurality of partially formed IC devices each having a plurality of via openings; a nozzle operable for dispensing a rinse fluid onto the wafer; and a processing system operable for controlling rotation of the wafer via operation of the motor, including while: (A) rinsing the wafer with the rinse fluid while rotating the wafer at a first speed; and (B) cleaning the wafer by increasing the wafer rotation to a second speed utilizing a constant acceleration that is no greater than 125 rpm/s.

The present disclosure also introduces a method of forming an IC, comprising: performing a fluid-based process on a semiconductor wafer including the IC at an intermediate stage of manufacturing, the fluid-based process including rotating the wafer at a first rotational speed; dispensing a rinse fluid onto the wafer after the fluid-based process; then increasing rotational speed of the wafer to a second rotational speed with a constant acceleration to a second rotational speed with a constant acceleration no greater than 125 rpm/s; maintaining the second rotational speed for a rinse fluid extraction period; and then reducing the rotational speed to zero.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same functions and/or achieving the same benefits of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. § 1.72(b) to permit the reader to quickly ascertain the nature of the technical disclosure. It is submitted with the understanding that it will not be used to interpret or limit the scope or meaning of the claims.

What is claimed is:

1. A method of forming an integrated circuit (IC), comprising:
    forming via openings in a dielectric layer over a semiconductor substrate;
    performing a spin-cleaning step at a first rotational speed on the semiconductor substrate;
    then dispensing a rinse fluid into the via openings;
    increasing a rotational speed of the semiconductor substrate with a constant acceleration no greater than 150 revolutions per minute per second (rpm/s) from the first rotational speed to a second rotational speed;
    maintaining the second rotational speed for a rinse fluid extraction period; and
    then reducing the rotational speed to zero.

2. The method of claim 1 wherein the constant acceleration is not greater than 50 rpm/s.

3. The method of claim 1 wherein the constant acceleration is not greater than 40 rpm/s.

4. The method of claim 1 wherein the constant acceleration is between 40 and 150 rpm/s.

5. The method of claim 1 further comprising maintaining the second rotational speed for at least 20 seconds.

6. The method of claim 1 wherein the via openings have an aspect ratio of at least 2.0.

7. The method of claim 6 wherein the via openings have a diameter not greater than 1 micron.

8. The method of claim 1 wherein the via openings have a diameter not greater than 1 micron.

9. The method of claim 1 wherein the rinse fluid is water.

10. The method of claim 1 wherein the rinse fluid is isopropyl alcohol.

11. A method of forming an integrated circuit (IC), comprising:
    forming via openings in a dielectric layer over a semiconductor wafer;
    performing a fluid-based process on the IC, the fluid-based process including rotating the semiconductor wafer at a first rotational speed;
    dispensing a rinse fluid onto the dielectric layer after the fluid-based process; and
    then increasing rotational speed of the semiconductor wafer with a constant acceleration to a second rotational speed over an acceleration period no less than five seconds.

12. The method of claim 11 wherein the constant acceleration is 70 revolutions per minute per second (rpm/s).

13. The method of claim 11 wherein the acceleration period is 10 seconds.

14. The method of claim 11 further comprising dispensing the rinse fluid during the acceleration period.

15. The method of claim 11 further comprising:
    maintaining the second rotational speed for a rinse fluid extraction period;
    dispensing the rinse fluid during the rinse fluid extraction period; and
    then reducing the rotational speed to zero.

16. The method of claim 11 further comprising dispensing the rinse fluid prior to, during, and after the acceleration period.

17. The method of claim 11 wherein the rinse fluid is isopropyl alcohol (IPA).

18. The method of claim 11 wherein the rinse fluid is water.

19. The method of claim 11 further comprising:
    maintaining the second rotational speed for a rinse fluid extraction period; and
    then reducing the rotational speed to zero;
    wherein the constant acceleration to the second rotational speed is no greater than 125 rpm/s.

20. The method of claim 11 wherein the via openings have an aspect ratio of at least 2.0.

* * * * *